US007847384B2

(12) United States Patent
Kobayashi et al.

(10) Patent No.: US 7,847,384 B2
(45) Date of Patent: Dec. 7, 2010

(54) SEMICONDUCTOR PACKAGE AND MANUFACTURING METHOD THEREOF

(75) Inventors: Tsuyoshi Kobayashi, Nagano (JP); Tetsuya Koyama, Nagano (JP); Takaharu Yamano, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/465,284

(22) Filed: Aug. 17, 2006

(65) Prior Publication Data

US 2007/0052083 A1  Mar. 8, 2007

(30) Foreign Application Priority Data

Aug. 23, 2005  (JP)  ............................. 2005-241740

(51) Int. Cl.
*H01L 23/02* (2006.01)

(52) U.S. Cl. ...................... 257/686; 257/678; 257/684; 257/687; 257/701; 257/702; 257/704; 257/658; 257/666; 257/667; 257/685; 257/688; 257/689; 257/693; 257/773; 257/775; 257/777; 257/788; 257/774; 257/4; 257/48; 257/E23.005; 257/E23.007; 257/E27.064; 257/E27.086; 257/E27.094; 257/E25.006; 257/E25.013; 257/E21.021; 257/E25.027; 257/E21.614

(58) Field of Classification Search ................. 257/658, 257/666, 667, 685, 686, 687, 688, 689, 693, 257/773, 775, 777, 788, 678, 684, 701, 702, 257/704, E23.005, E23.007
See application file for complete search history.

(56) References Cited

U.S. PATENT DOCUMENTS

| 5,726,493 | A | * | 3/1998 | Yamashita et al. | ........... 257/698 |
| 5,747,874 | A | * | 5/1998 | Seki et al. | ................... 257/686 |
| 6,740,964 | B2 | * | 5/2004 | Sasaki | ........................ 257/687 |
| 2002/0112884 | A1 | * | 8/2002 | Tanaka | ........................ 174/262 |
| 2006/0186524 | A1 | * | 8/2006 | Aiba et al. | .................. 257/686 |

FOREIGN PATENT DOCUMENTS

| JP | 2002-158312 | 5/2002 |
| JP | 2004-031650 | 1/2004 |
| JP | 2005-217225 | 8/2005 |

* cited by examiner

*Primary Examiner*—Victor A Mandala
*Assistant Examiner*—Fei Fei Yeung Lopez
(74) *Attorney, Agent, or Firm*—Rankin, Hill & Clark LLP

(57) ABSTRACT

A semiconductor package 100 is constructed of a semiconductor chip 110, a sealing resin 106 for sealing this semiconductor chip 110, and wiring 105 formed inside the sealing resin 106. And, the wiring 105 is constructed of pattern wiring 105*b* connected to the semiconductor chip 110 and also formed so as to be exposed to a lower surface 106*b* of the sealing resin 106, and a post part 105*a* formed so as to extend in a thickness direction of the sealing resin 106, the post part in which one end is connected to the pattern wiring 105*b* and also the other end is formed so as to be exposed to an upper surface 106*a* of the sealing resin 106.

7 Claims, 14 Drawing Sheets

SEMICONDUCTOR PACKAGE AND MANUFACTURING METHOD THEREOF

TECHNICAL FIELD

The present disclosure relates to a semiconductor package and a manufacturing method thereof, and particularly to a semiconductor package mounted in three dimensions and a manufacturing method thereof.

RELATED ART

In recent years, miniaturization and thinning have been strongly desired in electronic equipment etc. in which a semiconductor package is mounted. Because of this, a package structure referred to as the so-called package-on-package (POP) in which three-dimensional mounting can be performed by laminating the semiconductor packages in order to improve a mounting density of the semiconductor package has been proposed (for example, see Patent Reference 1: Japanese Patent Unexamined Publication No. 2002-158312).

In this kind of semiconductor package, a resin substrate in which wiring is formed is previously made and a component such as a semiconductor chip is installed on this resin substrate by a method of wire bonding or flip chip, etc. and thereafter, a sealing resin is formed by an epoxy molding resin.

Then, by irradiating the sealing resin with a laser, an opening for exposing wiring on the resin substrate is formed and also wiring is formed in the opening by a plating method. As a result of this, the wiring in which one end is connected to wiring of the resin substrate and the other end is exposed to an upper surface of the resin substrate is formed.

By forming the wiring extending through the sealing resin thus, another semiconductor package can be mounted on the upper surface of the resin substrate. In the related art, three-dimensional mounting of the semiconductor package could be performed by using such a technique.

However, in the related-art semiconductor package, the resin substrate is required, so that there is a problem that the semiconductor package becomes higher (thicker). Particularly, when the semiconductor packages having this resin substrate are laminated for three-dimensional mounting, a height as a whole after the lamination becomes high and it becomes difficult to reduce a height of electronic equipment etc. in which this semiconductor packages are installed.

Also, in the related-art semiconductor package, an opening is formed in a sealing resin by a laser in order to form wiring extending through the sealing resin, so that there was a problem that formation accuracy of the opening is low. As a result of this, there were problems that, for example, accuracy of the wiring formed in this opening also reduces and poor connection occurs in the upper and lower semiconductor packages at the time of three-dimensional mounting.

SUMMARY

Embodiments of the present invention provide a semiconductor package capable of achieving thinning and also improving accuracy of wiring formed by extending through a sealing resin, and a manufacturing method of the semiconductor package.

In order to solve the problems described above, the invention is characterized by taking each of the following measures.

According to a first aspect of one or more embodiments of the invention, there is provided with a semiconductor package which comprises a semiconductor chip; a sealing resin for sealing the semiconductor chip; and a wiring including a pattern wiring part which is connected to the semiconductor chip and is formed so as to be exposed to a first surface of the sealing resin, and a post part which is formed so as to extend in a thickness direction of the sealing resin, the post part having one end connected to the pattern wiring part and the other end formed so as to be exposed to a second surface opposite to the first surface of the sealing resin.

According to the invention, the need to use a resin substrate required in the related art is eliminated, so that cost reduction and thinning of a semiconductor package can be achieved. Also, a pattern wiring part of wiring is exposed to a first surface of a sealing resin and the end of a post part of the wiring is exposed to a second surface, so that plural semiconductor packages can be laminated to perform three-dimensional mounting.

Also, in the semiconductor package of the first aspect, a second aspect of one or more embodiments of the invention is characterized in that a first electrode on which an external connection terminal is disposed and a second electrode for test are formed on the pattern wiring part.

According to the invention, a first electrode on which an external connection terminal is disposed and also a second electrode for test are formed on the pattern wiring part, so that a known good determination of a semiconductor chip can be made using this second electrode.

Also, in the semiconductor package of the first or second aspect, a third aspect of one or more embodiments of the invention is characterized in that the post part has a columnar shape and is formed by a plating method.

According to the invention, the post part has a columnar shape with all the same sectional diameter, so that electrical characteristics can be improved as compared with a conic-shaped electrode etc.

Also, according to a fourth aspect one or more embodiments of the invention, there is provided with a manufacturing method of a semiconductor package in which a semiconductor chip is embedded in a sealing resin, and is characterized by having a first step of forming a pattern wiring part on a support substrate, a second step of forming a post part on the pattern wiring part by a plating method using a photoresist pattern, a third step of disposing the semiconductor chip on the support substrate and also connecting the semiconductor chip to the pattern wiring part, a fourth step of forming a sealing resin for sealing the post part and the semiconductor chip, and a fifth step of removing the support substrate.

According to the invention, a post part is formed by a plating method using a photoresist pattern. As a result of this, a pattern formed in the photoresist pattern in order to form the post part is formed by a photolithography technique, so that a pattern having a high aspect ratio with high accuracy can be formed. Therefore, the post part with high accuracy can be formed by plating and forming the post part using this photoresist pattern.

Also, in the manufacturing method of the semiconductor package of the fourth aspect, a fifth aspect of one or more embodiments of the invention is characterized in that in the fourth step, a liquid resin is used as material of the sealing resin and after the liquid resin is arranged on the support substrate, the liquid resin is hardened to form the sealing resin.

According to the invention, a liquid resin is used as material of the sealing resin and thereby, post parts can be sealed surely by the sealing resin even when multiple post parts are formed on a pattern wiring part so as to extend in a thickness direction.

Also, in the manufacturing method of the semiconductor package of the fourth aspect, a sixth aspect of one or more embodiments of the invention is characterized in that in the third step, the semiconductor chip is connected to the pattern wiring part by wire bonding.

According to the invention, the semiconductor chip is connected to the pattern wiring part by wire bonding and thereby, the connection can be made with high reliability. Also, a liquid resin is used as material of the sealing resin and thereby, a wire can be prevented from being deformed by arrangement of the liquid resin in a fourth step even when the semiconductor chip is connected to the pattern wiring part by the wire.

Also, in the manufacturing method of the semiconductor package of the fourth to sixth aspects, a seventh aspect of one or more embodiments of the invention is characterized in that in the first step, the pattern wiring part is formed after a stop layer is formed on the support substrate, and in the fifth step, removal of the support substrate is stopped by the stop layer.

According to the invention, removal of the support substrate is stopped by the stop layer, so that removal process of the support substrate can be prevented from having an influence on a layer of the inside from the stop layer. Also, management of removal process in the removal of the support substrate is facilitated and manufacture of the semiconductor package can be simplified.

Also, in the manufacturing method of the semiconductor package of the seventh aspect, an eighth aspect of one or more embodiments of the invention is characterized in that a first electrode on which an external connection terminal is disposed and a second electrode for test are formed on the pattern wiring part by patterning the stop layer after the fifth step.

According to the invention, first and second electrodes are formed using a stop layer for stopping removal of a support substrate, so that manufacturing steps can be simplified.

Various implementations may include one or more the following advantages. For example, the need to use a resin substrate required in the related art is eliminated, so that cost reduction and thinning of a semiconductor package can be achieved. Also, a post part is formed by a plating method using a photoresist pattern, so that the post part can be formed with high accuracy.

Other features and advantages may be apparent from the following detailed description, the accompanying drawings and the claims.

DETAILED DESCRIPTION

Next, the best mode for carrying out the invention will be described together with the drawings.

Figure 1:
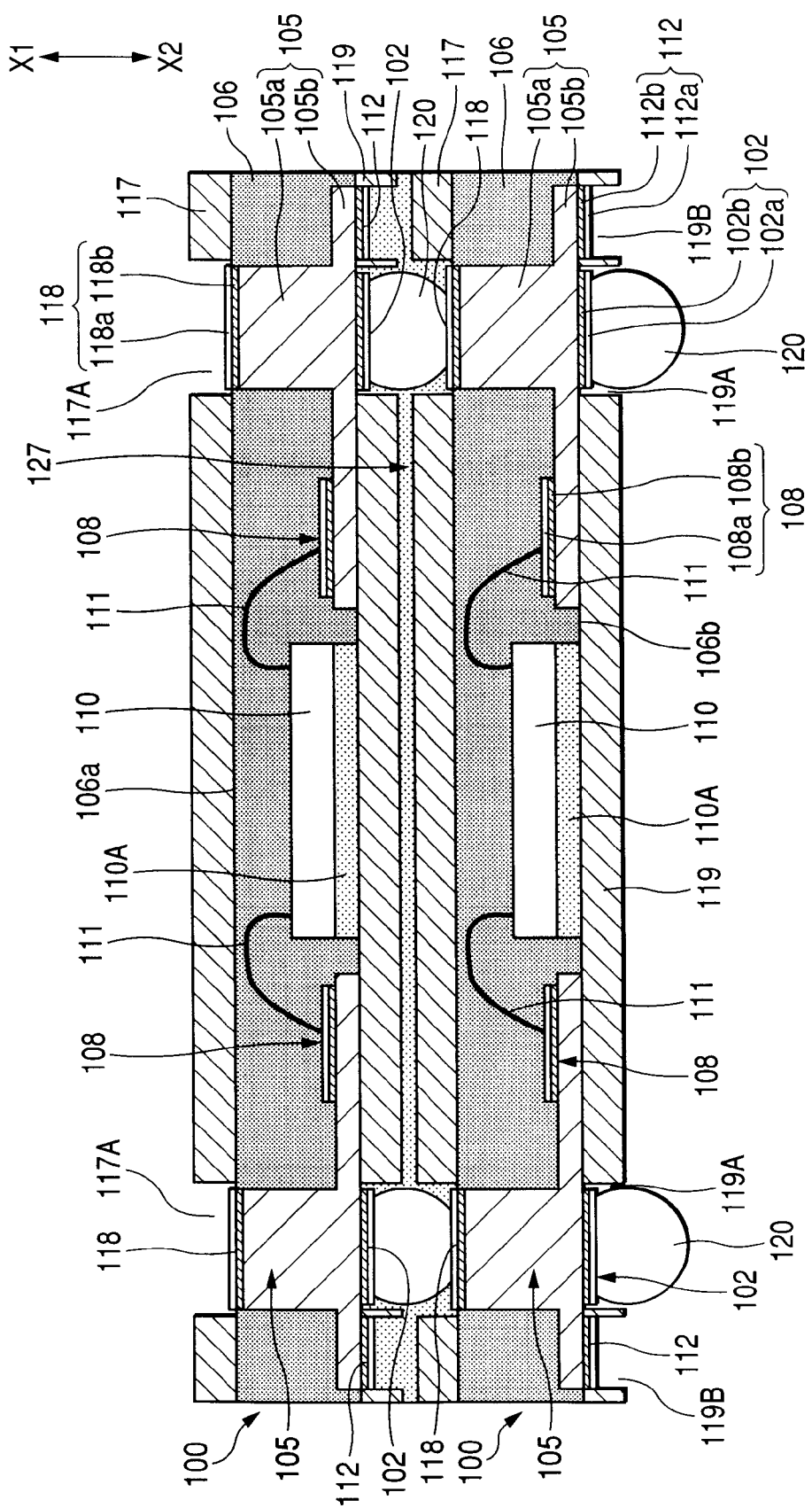
FIG. 1 is a sectional view showing a wiring substrate manufactured by a manufacturing method of the wiring substrate which is one embodiment of the invention.

FIG. 1 is a sectional view schematically showing a semiconductor package 100 which is one embodiment of the invention. FIG. 1 shows a state in which three-dimensional mounting is performed by laminating two semiconductor packages 100. This semiconductor package 100 is broadly constructed of wiring 105, a sealing resin 106, a semiconductor chip 110 and solder resists 117, 119, etc.

The wiring 105 is configured to integrally form a post part 105a and pattern wiring 105b. In the drawing, two wirings 105 are illustrated and multiple wirings 105 are formed in correspondence with electrode pads etc. formed on the semiconductor chip 110. This wiring 105 is formed by Cu (copper) with good conductivity.

The post part 105a is formed so as to extend in a thickness direction (upward and downward directions in the drawing) of the sealing resin 106. Also, the post part 105a has a columnar shape and is formed by a plating method as described below. An electrode 118 is formed on the upper end of this post part 105a by sequentially laminating an Ni layer 118b and an Au layer 118a.

This electrode 118 is configured to be exposed from an upper surface 106a (corresponding to a second surface described in the claim) of the sealing resin 106 and be exposed to the outside through an opening 117A formed in the solder resist 117 disposed on the upper surface of the sealing resin 106. On the other hand, the lower end of the post part 105a is configured to be connected to the pattern wiring 105b. In addition, it is assumed that a direction shown by arrow X1 in the drawing is an upward direction and a direction shown by arrow X2 in the drawing is a downward direction in the following description.

On the other hand, the pattern wiring 105b is formed so as to extend in a surface direction (upward and downward directions with respect to a paper surface and left and right directions in the drawing) of the sealing resin 106 by a predetermined pattern. A lower surface of this pattern wiring 105b is exposed from a lower surface 106b (corresponding to a first surface described in the claim) of the sealing resin 106.

An electrode 102 in which an Ni layer 102b and an Au layer 102a are sequentially laminated and a test pad 112 in which an Ni layer 112b and an Au layer 112a are sequentially laminated similarly are formed on a surface exposed from the lower surface 106b of the pattern wiring 105b. This electrode 102 and the test pad 112 are collectively formed as described below.

The electrode 102 is exposed to the outside through an opening 119A formed in the solder resist 119 disposed on the lower surface 106b of the sealing resin 106. Also, the test pad 112 is exposed to the outside through an opening 119B formed in the solder resist 119. The present embodiment is configured to arrange an external connection terminal 120 made of a solder ball on the electrode 102.

Also, a bonding pad 108 is formed in an upper surface position of the inside from a formation position of the post part 105a of the pattern wiring 105b. This bonding pad 108 is configured to laminate an Ni layer 108b and an Au layer 108a on an upper surface of the pattern wiring 105b.

The semiconductor chip 110 is configured to be embedded in the sealing resin 106. In the embodiment, the semiconductor chip 110 is formed face up and a wire 111 is arranged between an electrode pad (not shown) formed on an upper surface of the semiconductor chip 110 and the bonding pad 108 formed on the wiring 105 by a wire bonding method. As a result of this, the semiconductor chip 110 is configured to be electrically connected to the wiring 105 (post part 105a, pattern wiring 105b) through the wire 111.

In addition, a die attachment film layer 110A is disposed on a lower portion of the semiconductor chip 110, and a lower surface of this die attachment film layer 110A is configured to face the solder resist 119. Also, the embodiment is configured to connect the semiconductor chip 110 to the wiring 105 by the wire bonding method, but the semiconductor chip 110 can also be connected to the wiring 105 by flip chip bonding. In this case, the need for the die attachment film layer 110A is eliminated.

The sealing resin 106 is a substance in which a liquid resin is hardened as described below. As material of this sealing resin 106, for example, an epoxy liquid potting material or a liquid molding material can be used and a liquid crystal polymer can also be used.

This sealing resin 106 is formed so as to cover the wiring 105, the semiconductor chip 110 and the wire 111. However, the upper surface (on which the electrode 118 is formed) of the post part 105a constructing the wiring 105, the bottom surface of the pattern wiring 105b constructing the wiring 105 and the lower surface of the die attachment film layer 110A arranged on the lower portion of the semiconductor chip 110 are configured to be exposed from the sealing resin 106.

The solder resist layer 117 is formed on the upper surface 106a of the sealing resin 106 and the solder resist 119 is formed on the lower surface 106b of the sealing resin 106 as described above. In addition, in the embodiment, the external connection terminal 120 is formed on the electrode 102, but the external connection terminal 120 may be configured to be formed on the electrode 118.

In the example shown in FIG. 1, a pair of the semiconductor packages 100 are configured to perform three-dimensional mounting by joining the external connection terminal 120 of the semiconductor package 100 located in the upper portion to the electrode 118 of the semiconductor package 100 located in the lower portion. In this case, an NCF 127 (Non-Conductive Film) made of resin is arranged between the semiconductor package 100 located in the upper portion and the semiconductor package 100 located in the lower portion.

In the case of joining a pair of the upper and lower semiconductor packages 100, this NCF 127 is previously arranged on the solder resist 117 of the semiconductor package 100 located in the lower portion and is simultaneously hardened in the case of joining the external connection terminal 120 of the semiconductor package 100 located in the upper portion to the electrode 118 of the semiconductor package 100 located in the lower portion. In addition, installation of this NCF 127 is not indispensable.

In the semiconductor package 100 configured as described above, a resin substrate is not used unlike the related-art semiconductor package, so that cost reduction and thinning of the semiconductor package 100 can be achieved. Also, the test pad 112 for test together with the electrode 102 on which the external connection terminal 120 is disposed are formed on the pattern wiring 105b, so that the determination of the reliability (KGD: Known Good Die) of the semiconductor chip 110 sealed can be made using this test pad 112. Further, in the embodiment, the post part 105a constructing the wiring 105 has a columnar shape with all the same sectional diameter and is formed by a plating method. As a result of this, electrical characteristics can be improved as compared with a configuration in which a via plug is formed in a conic-shaped opening formed using, for example, a laser.

Next, a manufacturing method of the semiconductor package 100 configured as described above will be described using FIGS. 2 to 14.

Figure 2:
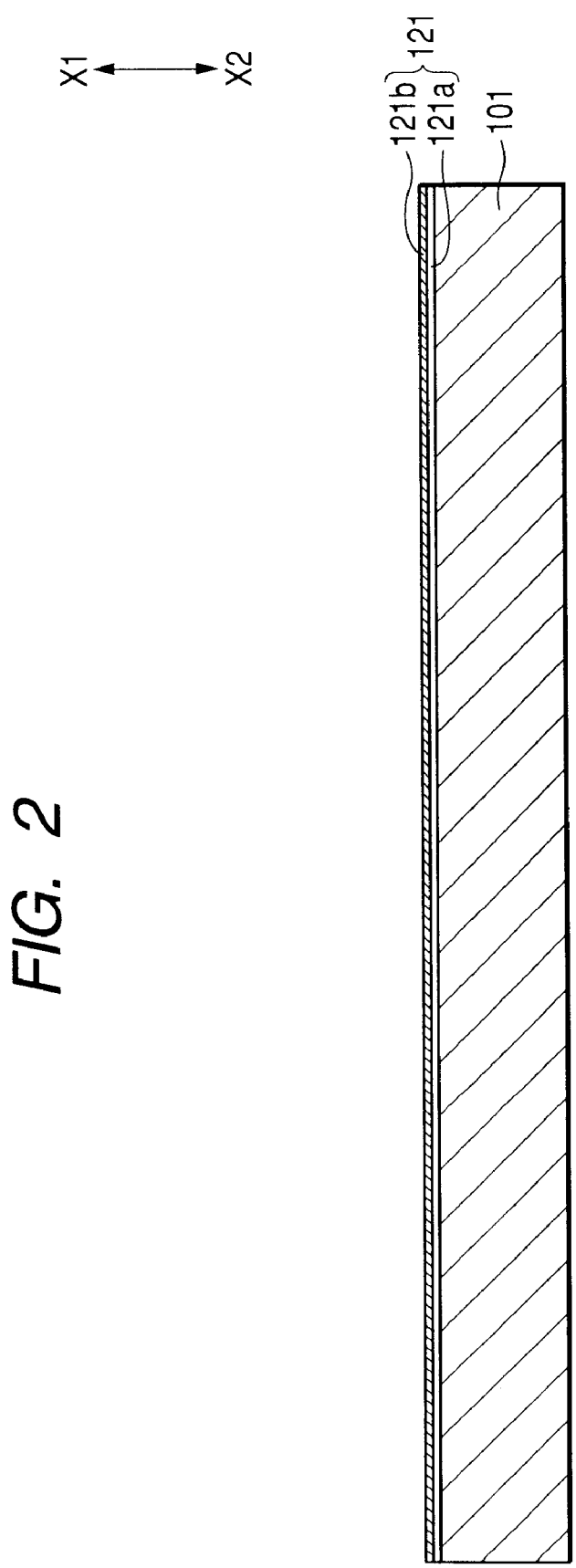
FIG. 2 is a diagram showing the manufacturing method of the wiring substrate which is one embodiment of the invention by following a procedure (first).

First, in a step shown in FIG. 2, a support substrate 101 made of a conductive material (for example, Cu) is prepared. Then, a stop layer 121 is formed on this support substrate 101 using an electrolytic plating method.

This stop layer 121 is formed by sequentially laminating an Au layer 121a with a thickness of 0.1 to 0.2 μm and an Ni layer 121b with a thickness of 0.1 to 3 μm using the support substrate 101 as an electrode using the electrolytic plating method. In this case, in the above electrolytic plating and electrolytic plating of subsequent steps, the support substrate 101 and the stop layer 121 form a current-carrying path, so that the support substrate 101 is preferably a conductive material and also is more preferably a material with low resistance such as Cu.

Figure 3:
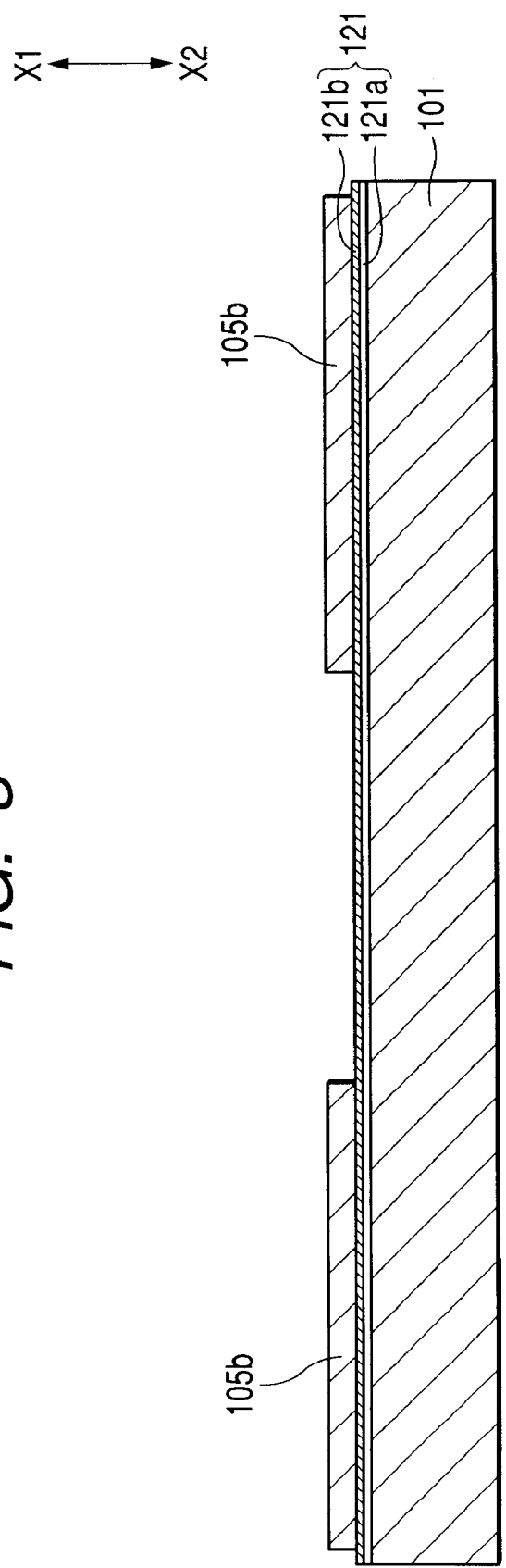
FIG. 3 is a diagram showing the manufacturing method of the wiring substrate which is one embodiment of the invention by following a procedure (second).

In the next step shown in FIG. 3, pattern wiring 105b is formed on the support substrate 101 on which the stop layer 121 is formed. Concretely, the pattern wiring 105b is formed by forming a photoresist pattern (not shown) by a photolithography method and precipitating Cu by electrolytic plating using this resist pattern as a mask and then removing the resist pattern. Also, in the embodiment, the pattern wiring 105b is formed in the periphery of the center portion excluding the center portion in which a semiconductor chip 110 described below is installed.

Figure 4:
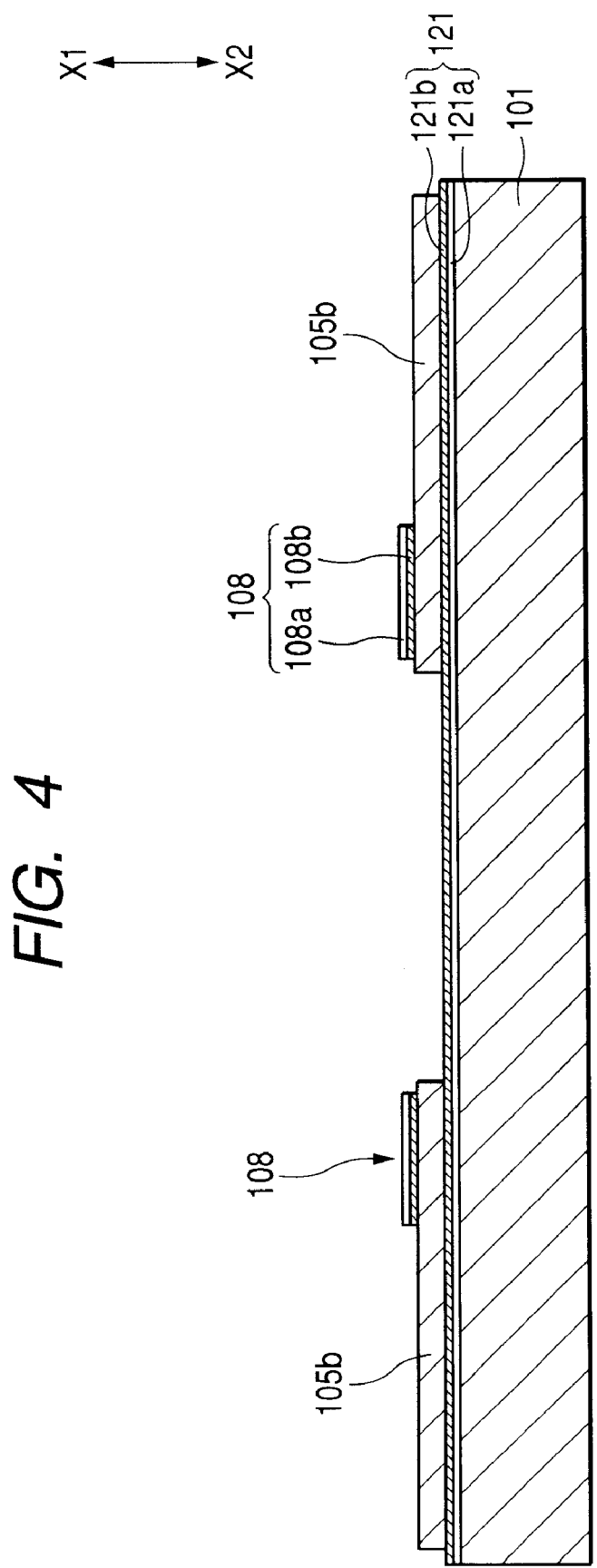
FIG. 4 is a diagram showing the manufacturing method of the wiring substrate which is one embodiment of the invention by following a procedure (third).

Then, in a step shown in FIG. 4, a bonding pad 108 is formed in an inside position (position near to the center) of the pattern wiring 105b. This bonding pad 108 is formed by forming a photoresist pattern on the pattern wiring 105b and sequentially laminating an Ni layer 108b and an Au layer 108a using this photoresist pattern as a mask using an electrolytic plating method.

Figure 5:
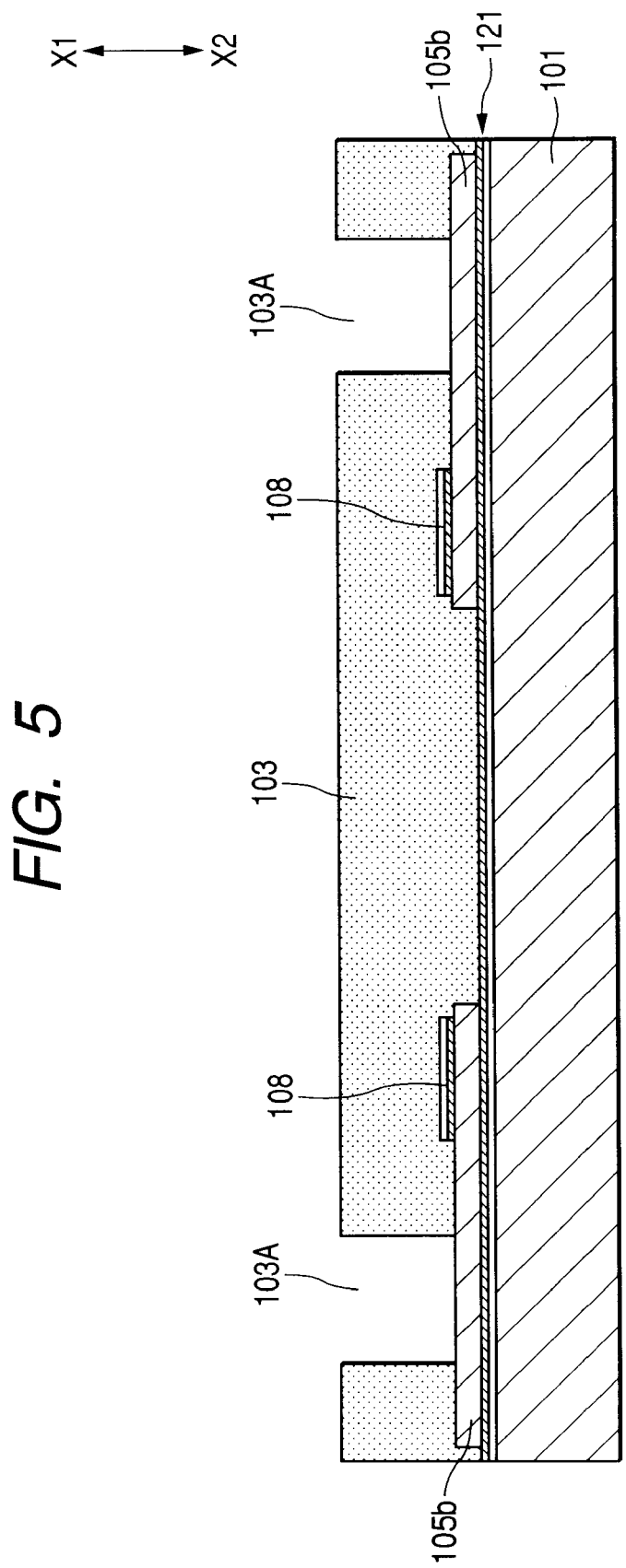
FIG. 5 is a diagram showing the manufacturing method of the wiring substrate which is one embodiment of the invention by following a procedure (fourth).

Then, in a step shown in FIG. 5, a photoresist pattern 103 is formed on the support substrate 101 so as to cover the pattern wiring 105b. In this photoresist pattern 103, a photoresist is first applied to the support substrate 101 at a predetermined thickness using a spinner etc. and this photoresist is patterned by a photolithography method and thereby, the photoresist pattern 103 having openings 103A is formed.

Figure 6:
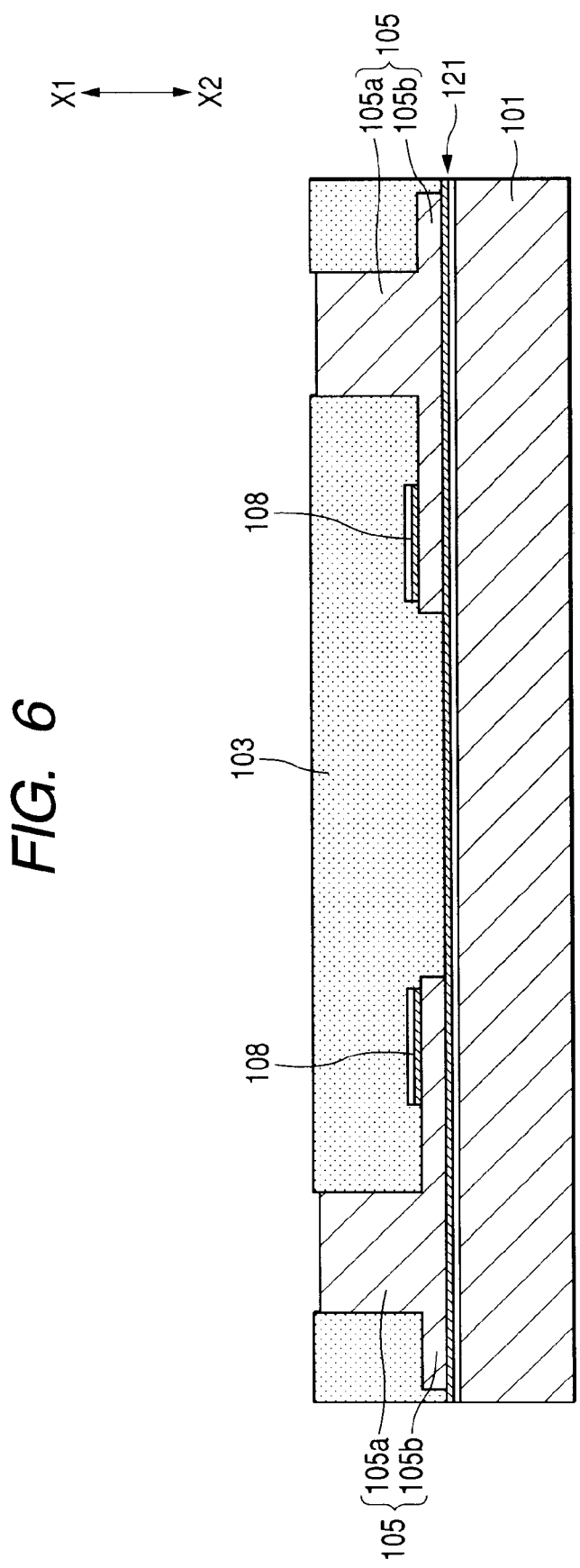
FIG. 6 is a diagram showing the manufacturing method of the wiring substrate which is one embodiment of the invention by following a procedure (fifth).

Then, in a step shown in FIG. 6, using this photoresist pattern 103 as a mask, Cu is precipitated by electrolytic plating and post parts 105a are precipitated inside the openings 103A. As a result of this, wiring 105 made of the post part 105a and the pattern wiring 105b is formed.

The post part 105a formed thus is configured to extend in upward and downward directions in the drawing (a thickness direction of the semiconductor package 100 manufactured). Also, the lower end of the post part 105a is configured to be integrally connected to the pattern wiring 105b and the upper end is configured to be exposed to the outside from the opening 103A.

Figure 7:
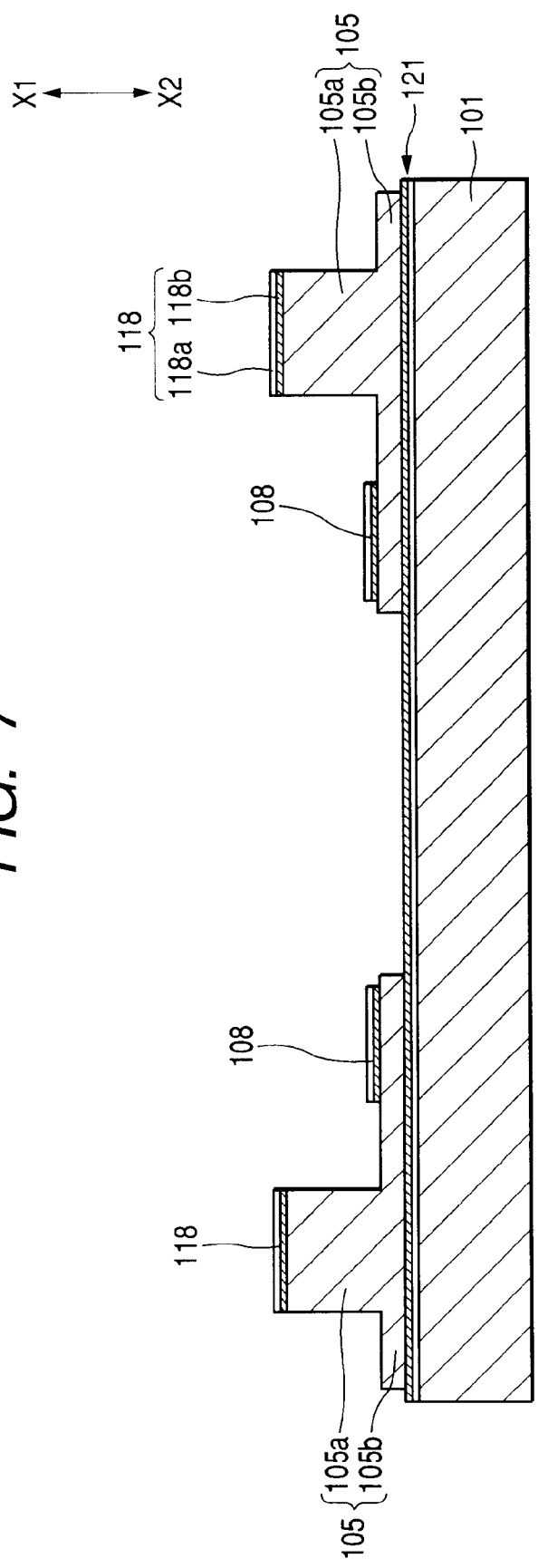
FIG. 7 is a diagram showing the manufacturing method of the wiring substrate which is one embodiment of the invention by following a procedure (sixth).

Then, an electrode 118 is formed on the end exposed from the opening 103A of the post part 105a. This electrode 118 is formed by sequentially laminating an Ni layer 118b and an Au layer 118a using an electrolytic plating method. When the post part 105a (wiring 105) and the electrode 118 are formed as described above, the photoresist pattern 103 is removed. FIG. 7 shows a state in which the photoresist pattern 103 is removed.

Figure 8:
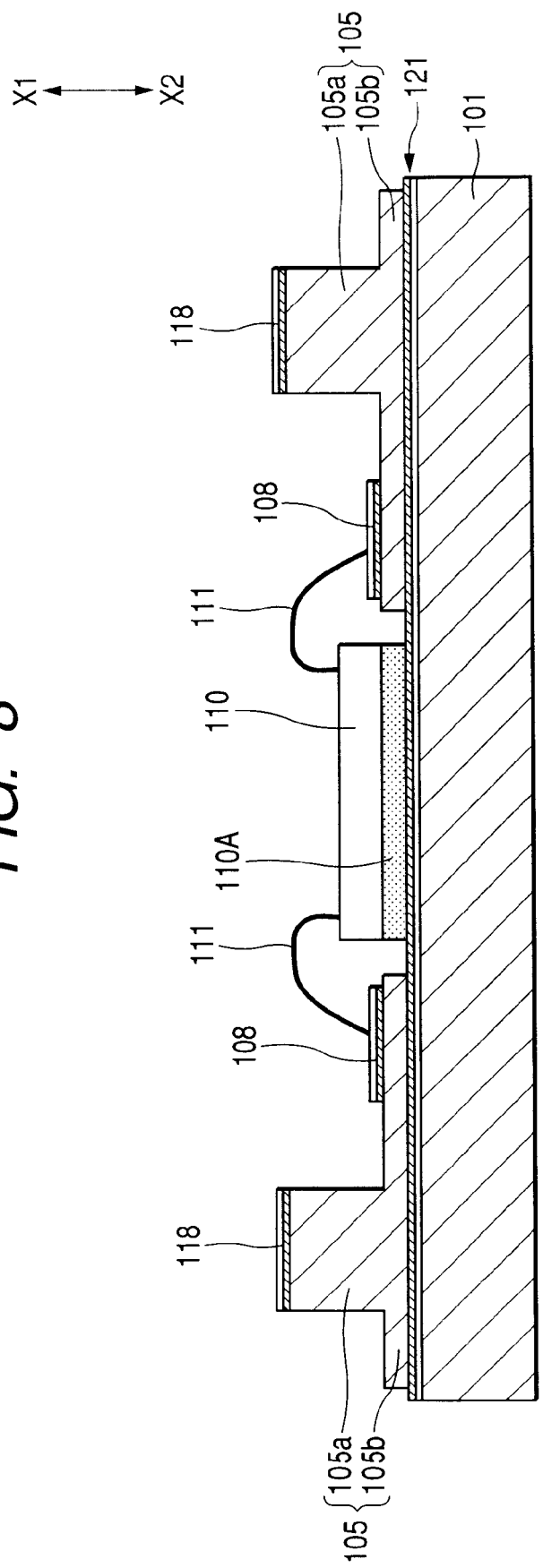
FIG. 8 is a diagram showing the manufacturing method of the wiring substrate which is one embodiment of the invention by following a procedure (seventh).

Then, in a step shown in FIG. 8, process for installing the semiconductor chip 110 on the stop layer 121 is performed. Concretely, the semiconductor chip 110 is fixed to the stop layer 121 face up using a die attachment film layer 110A.

Subsequent to this, an electrode pad formed on the semiconductor chip 110 is connected to the bonding pad 108 formed on the wiring 105 by a wire 111 using a wire bonding apparatus. As a result of this, it is configured to make electrical connection between the semiconductor chip 110 and the wiring 105. In the embodiment, a wire bonding method is used in installation of the semiconductor chip 110, so that the semiconductor chip 110 can be connected to the wiring 105 inexpensively with high reliability.

Figure 9:
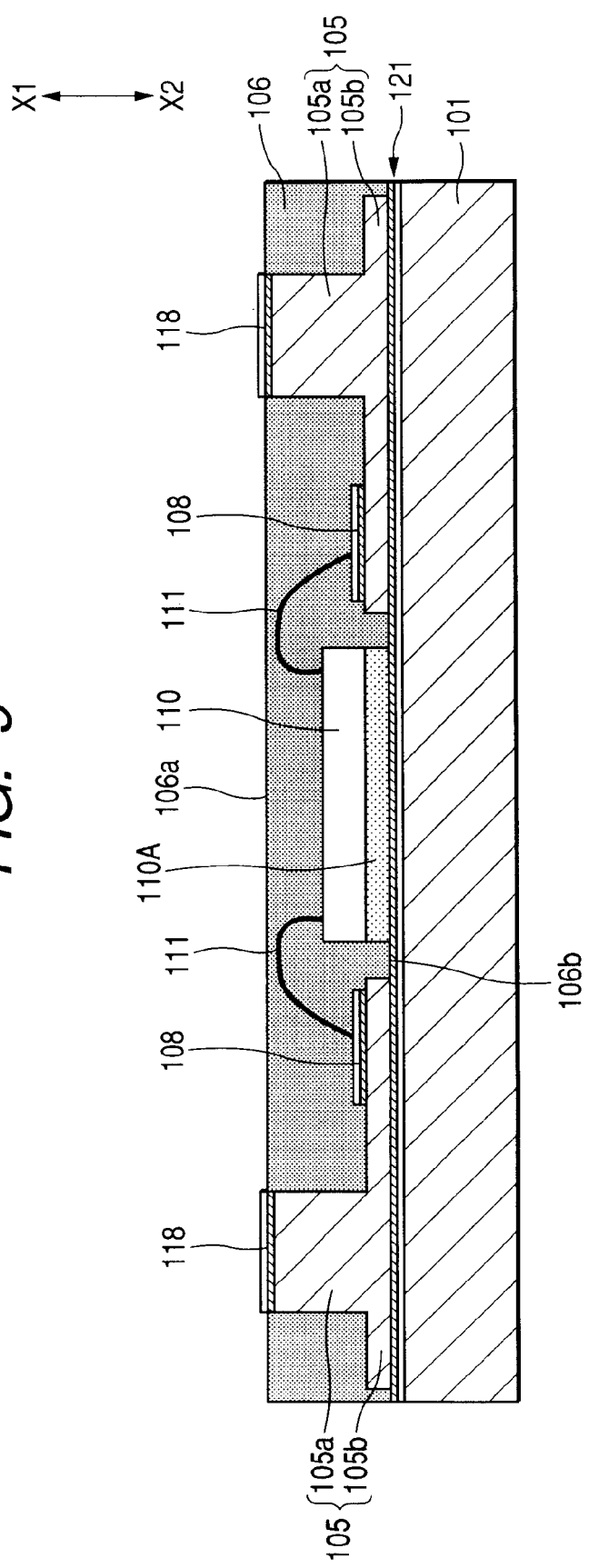
FIG. 9 is a diagram showing the manufacturing method of the wiring substrate which is one embodiment of the invention by following a procedure (eighth).

Then, in a step shown in FIG. 9, a sealing resin 106 is formed. The embodiment is characterized by using a liquid resin as material of the sealing resin 106. As the liquid resin, an epoxy liquid potting material or a liquid molding material can be used and a liquid crystal polymer can also be used. In addition, when the liquid potting material or the liquid molding material is used as the liquid resin, hardening treatment is performed after being arranged on the support substrate 101.

By using the liquid resin as the sealing resin 106 thus, the liquid resin smoothly moves between the post parts 105a even when many post parts 105a are formed on the pattern wiring 105b so as to extend in a thickness direction (upward direction in the drawing). As a result of this, even when many post parts 105a are present, an air gap is not formed inside the sealing resin 106 and the wiring 105 and the semiconductor chip 110, etc. can be sealed surely. Also, by using the liquid resin as material of the sealing resin 106, even when the semiconductor chip 110 is connected to the pattern wiring part 105b by a wire, the wire 111 is not deformed at the time of arrangement of the liquid resin and a yield can be improved.

In addition, polishing treatment may be performed with respect to an upper surface 106a of the sealing resin 106 in order to surely expose the electrode 118 from the sealing resin 106 after arrangement of the sealing resin 106.

Figure 10:
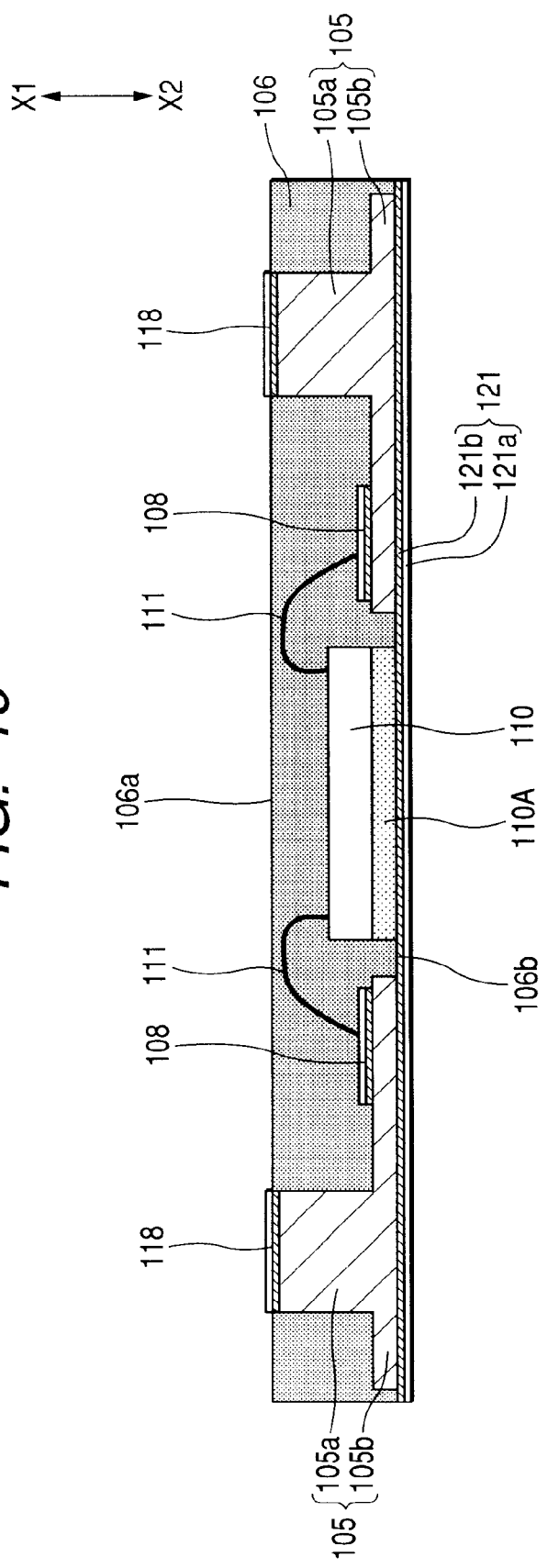
FIG. 10 is a diagram showing the manufacturing method of the wiring substrate which is one embodiment of the invention by following a procedure (ninth).

Then, in a step shown in FIG. 10, process for removing the support substrate 101 by etching is performed. In this case, an etching solution in which the support substrate 101 (Cu) dissolves but the stop layer 121 does not dissolve is used as the etching solution. As a result of this, removal of the support substrate 101 is stopped by the stop layer 121, so that the etching solution can be prevented from having an influence on the layers (the wiring 105, the sealing resin 106, the semiconductor chip 110, etc.) of the inside from the stop layer 121.

Also, management of removal process in the removal of the support substrate 101 is facilitated and manufacture of the semiconductor package 100 can be simplified.

In addition, by removing the support substrate 101, a configuration in which a member for supporting the sealing resin 106 is not present is formed, but at a point in time of removing the support substrate 101, the sealing resin 106 hardens to ensure predetermined rigidity. Therefore, even when the support substrate 101 is not present, each of the steps subsequent to this can be performed.

Figure 11:
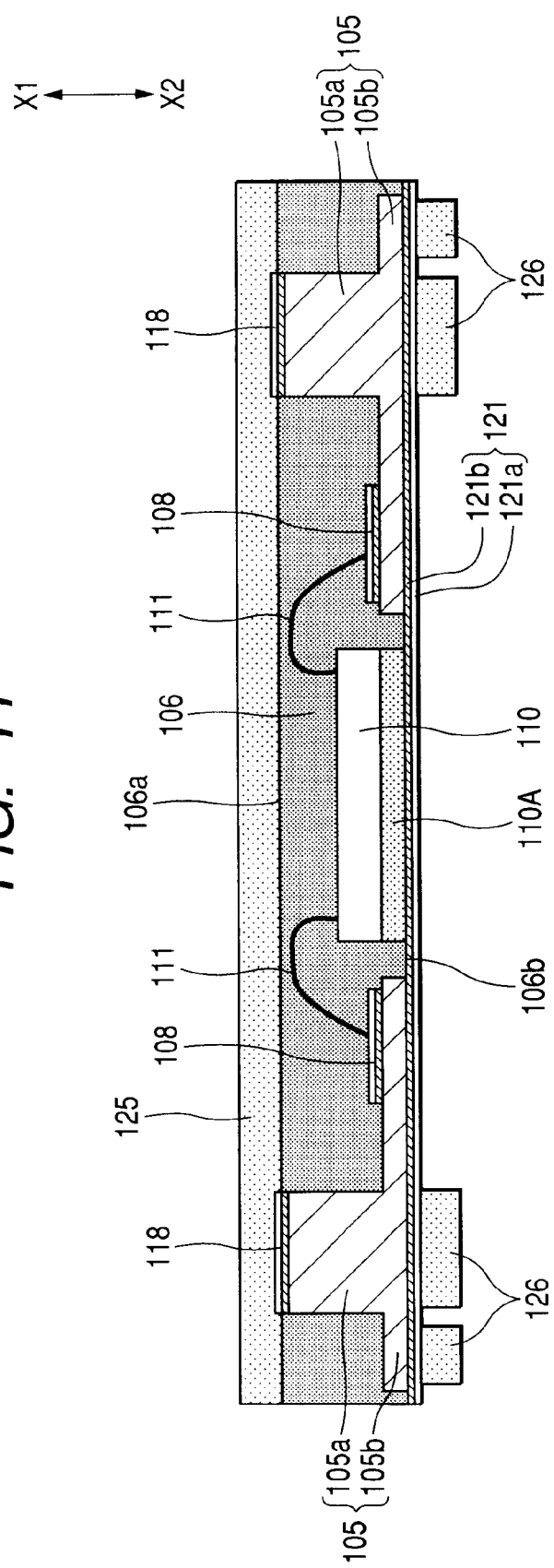
FIG. 11 is a diagram showing the manufacturing method of the wiring substrate which is one embodiment of the invention by following a procedure (tenth).

Then, in a step shown in FIG. 11, a resist pattern 125 is formed on the upper surface 106a of the sealing resin 106 and also a resist pattern 126 is formed on a lower surface 106b. The resist pattern 125 is formed on all the upper surface 106a. On the other hand, the resist pattern 126 formed on the lower surface 106b is patterned using a photolithography method and thereby is formed in only a formation position of a test pad 112 and a formation position of an electrode 102 to which an external connection terminal 120 is later connected.

Figure 12:
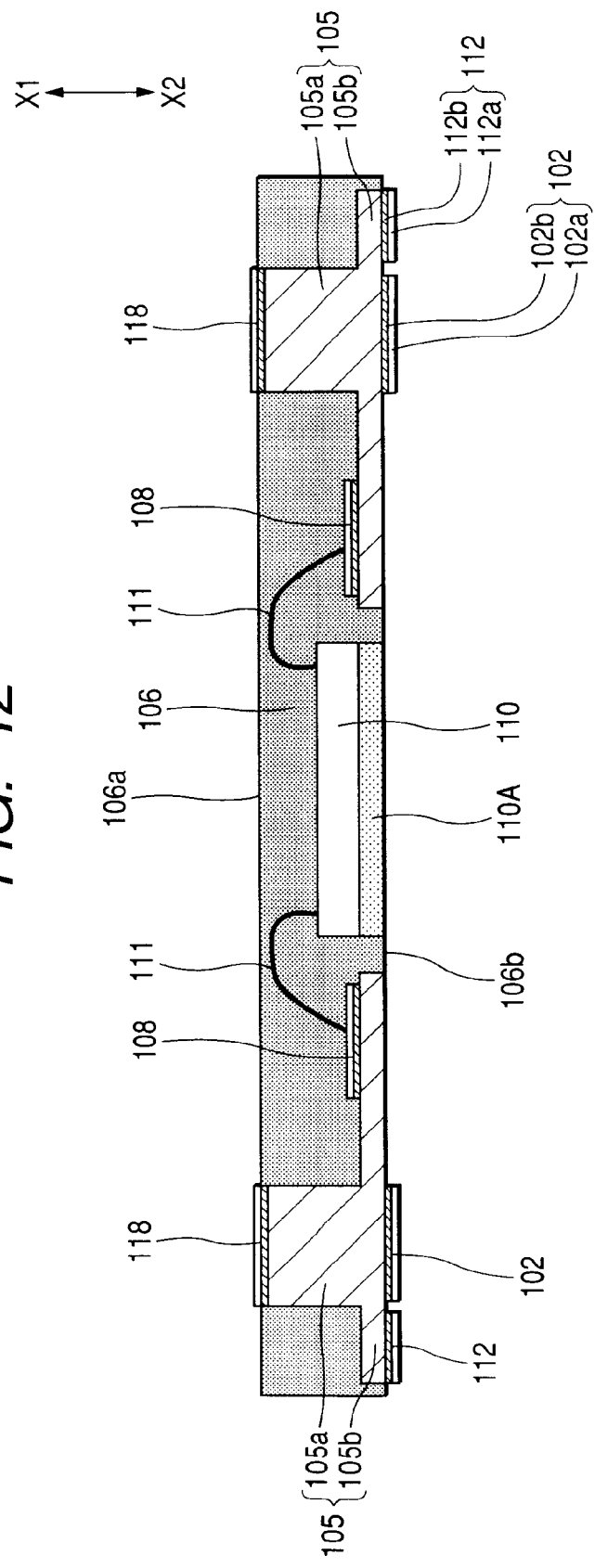
FIG. 12 is a diagram showing the manufacturing method of the wiring substrate which is one embodiment of the invention by following a procedure (eleventh).

Then, etching process of the stop layer 121 (Au layer 121a, Ni layer 121b) is performed using the resist patterns 125, 126 as a mask. As a result of this, with the electrode 102 and the test pad 112 left, the other portions of the stop layer 121 are removed. Subsequently, the resist patterns 125, 126 are removed. FIG. 12 shows a state in which the resist patterns 125, 126 are removed.

In the embodiment as described above, in removal process of the support substrate 101, it is configured to use the stop layer 121 having a function of stopping the removal of the support substrate 101 and form the electrode 102 and the test pad 112 by patterning this stop layer 121. As a result of this, manufacturing steps can be simplified as compared with a method for forming the electrode 102 and the test pad 112 by forming a conductive film separately from the stop layer 121.

In addition, the electrode 118 (made of the Au layer 118a and the Ni layer 118b) formed on the upper end of the post part 105a is protected by the resist pattern 125. As a result of this, the electrode 118 is not removed at the time of etching of the stop layer 121.

Figure 13:
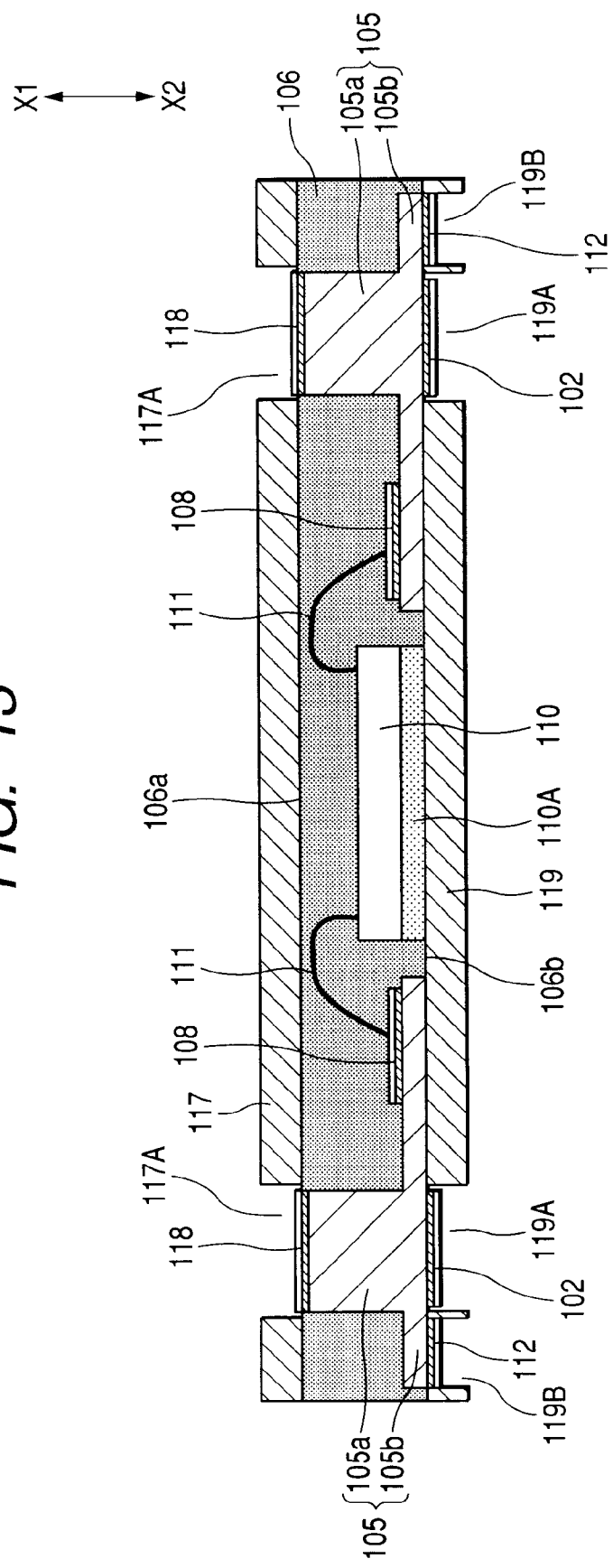
FIG. 13 is a diagram showing the manufacturing method of the wiring substrate which is one embodiment of the invention by following a procedure (twelfth).

Then, in a step shown in FIG. 13, a solder resist 117 is formed on the upper surface 106a of the sealing resin 106 and also a solder resist 119 is formed on the lower surface 106b of the sealing resin 106. Substantially the whole surface of the upper surface 106a is covered with the solder resist 117, but openings 117A are formed in positions opposite to the electrodes 118. Therefore, the electrodes 118 are configured to be exposed to the outside through the openings 117A.

Also, the solder resist 119 is formed so as to cover the lower surface 106b of the sealing resin 106, a lower surface of the pattern wiring 105b and a die attachment film layer 110A. However, openings 119A are formed in positions opposite to the electrodes 102 of the solder resist 119, and openings 119B are formed in positions opposite to the test pads 112. Therefore, the electrodes 102 are configured to be exposed to the outside through the openings 119A and also the test pads 112 are configured to be exposed to the outside through the openings 119B.

Figure 14:
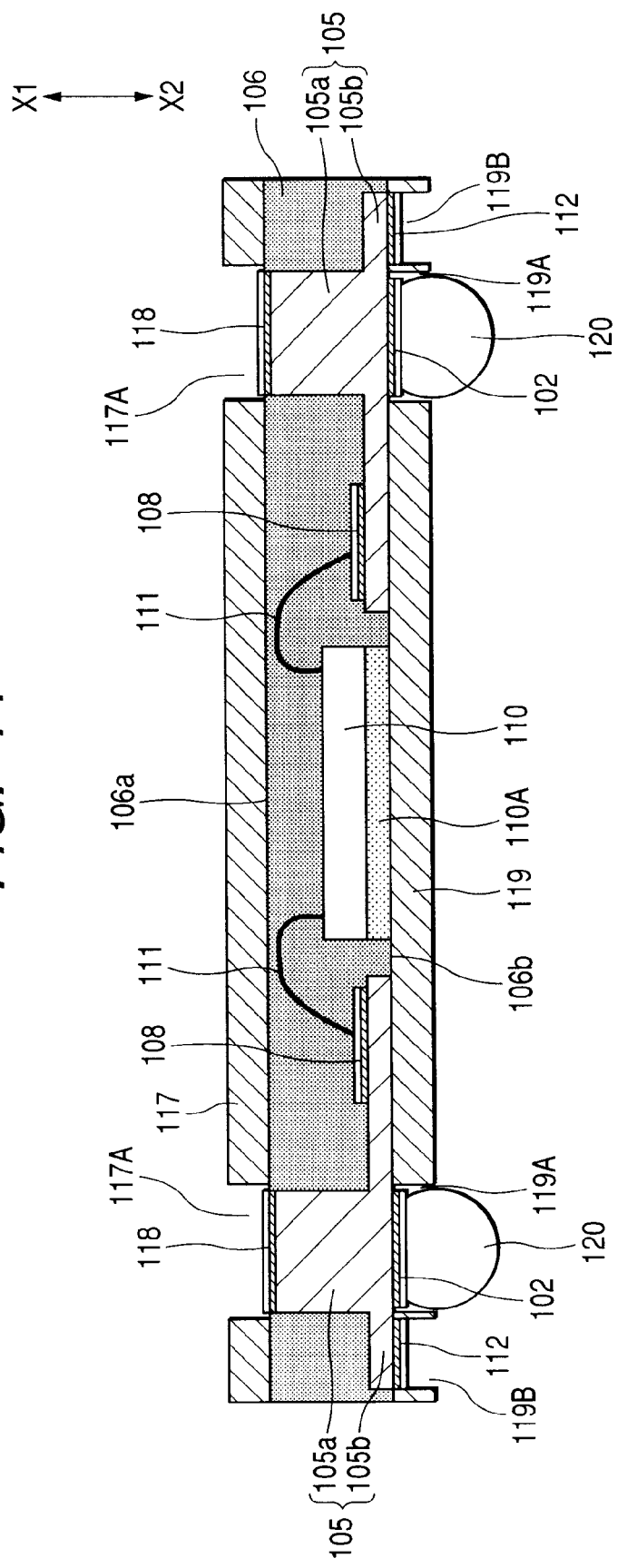
FIG. 14 is a diagram showing the manufacturing method of the wiring substrate which is one embodiment of the invention by following a procedure (thirteenth).

Then, in a step shown in FIG. 14, the semiconductor package 100 shown in FIG. 1 can be formed by joining solder balls and forming external connection terminals 120 on the electrodes 102.

In the manufacturing method according to the embodiment described above, the post part 105a is formed by a plating method using the photoresist pattern 103 as described above. As a result of this, the opening 103A formed in the photoresist pattern 103 in order to form the post part 105a is formed using a photolithography technique, so that a pattern having a high aspect ratio with high accuracy can be formed.

By plating and forming the post part 105a using the photoresist pattern 103 thus, the post part 105a with high accuracy can be formed. Therefore, connection between the external connection terminal 120 and the electrode 118 can be made surely even when plural semiconductor packages 100 are laminated to perform three-dimensional mounting as shown in FIG. 1.

Also, by forming the post part 105a by the opening 103A having a high aspect ratio as described above, the post part 105a has a columnar shape with all the uniform cross section in a thickness direction and wiring with good electrical characteristics can be formed and it can also cope well with a high-frequency signal.

In addition, in the manufacturing method of the semiconductor package described above, a procedure for manufacturing one semiconductor package 100 from one support substrate 101 has been illustrated and described for convenience of illustration, but the so-called multiple packages are manufactured actually. That is, multiple semiconductor packages 100 are formed on one support substrate 101 and after the step shown in FIG. 14, the sealing resin 106 or the solder resists 117, 119 are cut in a predetermined position and individual semiconductor packages 100 are manufactured.

The invention has been described above by the preferred embodiment, but the invention is not limited to the specific embodiment described above, and various modifications and changes can be made within the gist described in the claims.

Concretely, the embodiment described above has been configured to use the Au layer 112a which is noble metal together with the Ni layer 112b as the stop layer 121. However, use of the noble metal such as Au probably increases manufacturing cost of the semiconductor package 100. Hence, it may be configured to use only the Ni layer as the stop layer 121. However, in this case, for example, in the step shown in FIG. 13, after the solder resist 119 is formed, the Au layer 121a is formed on the nickel (Ni) layer 121b of the test pad 112 and the electrode 102 by giving electroless plating.

What is claimed is:

1. A semiconductor package comprising:
    a semiconductor chip;
    a sealing resin for sealing the semiconductor chip, the sealing resin comprised of a single-continuous layer of resin and defining a first surface at a lower extent of the sealing resin and a second surface opposite from the first surface at an upper extent of the sealing resin;
    a wiring including a pattern wiring part connected to the semiconductor chip and a post part, the pattern wiring part having a lower surface and an upper surface and is formed such that the lower surface is exposed from the first surface of the sealing resin and the upper surface is in contact with the first surface of the sealing resin, the post part extending in a thickness direction of the sealing resin and having a first end connected to the upper surface of the pattern wiring part and a second end exposed from said second surface of said sealing resin;
    a first electrode in contact with the lower surface of the pattern wiring part;
    a second electrode on the second end of the post part which is exposed from the second surface of the sealing resin; and
    a test electrode formed directly on the lower surface of the pattern wiring part adjacent to the first electrode,
    wherein the test electrode remains open to the outside for testing said semiconductor chip, and
    wherein the first electrode includes a first layer formed on the lower surface of the pattern wiring part and a second layer formed on the first layer.

2. The semiconductor package as claimed in claim 1, wherein the post part has a columnar shape and is formed by a plating method.

3. The semiconductor package as claimed in claim 1 wherein:
    the lower surface of the pattern wiring part exposed from the sealing resin defines an electrode formation portion; and,
    the first end of the post part of the wiring is connected with the upper surface of the pattern wiring part at the electrode formation portion.

4. The semiconductor package as claimed in claim 1, wherein:
    the first layer is a nickel layer formed on the lower surface of the pattern wiring part; and,
    the second layer is a gold layer formed on the nickel layer.

5. A semiconductor package comprising:
    a semiconductor chip;
    a sealing resin for sealing the semiconductor chip, the sealing resin comprised of a single-continuous layer of resin and defining a first surface at a lower extent of the sealing resin and a second surface opposite from the first surface at an upper extent of the sealing resin;
    a wiring including a pattern wiring part connected to the semiconductor chip and a post part, the pattern wiring part having a lower surface and an upper surface and is formed such that the lower surface is exposed from the first surface of the sealing resin and the upper surface is in contact with the first surface of the sealing resin, the post part extending in a thickness direction of the sealing resin and having a first end connected to the upper surface of the pattern wiring part and a second end exposed from said second surface of said sealing resin;
    a first electrode in contact with the lower surface of the pattern wiring part;
    a second electrode on the second end of the post part which is exposed from the second surface of the sealing resin;
    a test electrode formed directly on the lower surface of the pattern wiring part adjacent to the first electrode; and
    an external connection terminal on the first electrode,
    wherein the test electrode remains open to the outside for testing said semiconductor chip.

6. The semiconductor package as claimed in claim 5, wherein the external connection terminal is a solder ball on the first electrode.

7. The semiconductor package as claimed in claim 1, wherein the semiconductor chip is embedded in the sealing resin.

* * * * *